United States Patent
Hiscock et al.

(10) Patent No.: US 11,276,454 B2
(45) Date of Patent: Mar. 15, 2022

(54) MEMORY WITH PARTIAL ARRAY REFRESH

(71) Applicant: Micron Technology, Inc., Boise, ID (US)

(72) Inventors: Dale H. Hiscock, Boise, ID (US);
Debra M. Bell, Boise, ID (US);
Michael Kaminski, Boise, ID (US);
Joshua E. Alzheimer, Boise, ID (US);
Anthony D. Veches, Boise, ID (US);
James S. Rehmeyer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/939,669

(22) Filed: Jul. 27, 2020

(65) Prior Publication Data

US 2020/0357461 A1 Nov. 12, 2020

Related U.S. Application Data

(63) Continuation of application No. 16/237,013, filed on Dec. 31, 2018, now Pat. No. 10,762,946.

(51) Int. Cl.
*G11C 16/34* (2006.01)
*G11C 11/406* (2006.01)
*G11C 11/4074* (2006.01)
*G11C 16/10* (2006.01)
*G11C 11/4072* (2006.01)

(52) U.S. Cl.
CPC .... *G11C 11/40622* (2013.01); *G11C 11/4072* (2013.01); *G11C 11/4074* (2013.01); *G11C 11/40615* (2013.01); *G11C 11/40618* (2013.01); *G11C 16/10* (2013.01); *G11C 2211/406* (2013.01)

(58) Field of Classification Search
CPC ........ G11C 11/40622; G11C 11/40615; G11C 11/40618; G11C 11/4072; G11C 11/4074; G11C 16/10
USPC ...................................................... 365/222
See application file for complete search history.

(56) References Cited

U.S. PATENT DOCUMENTS

| | | |
|---|---|---|
| 7,079,444 B2 | 7/2006 | Lee |
| 7,969,807 B2 | 6/2011 | Hokenmaier et al. |
| 8,817,549 B2 | 8/2014 | Shin et al. |
| 8,848,462 B2 | 9/2014 | Luo et al. |
| 9,076,548 B1 | 7/2015 | Park et al. |

(Continued)

*Primary Examiner* — Xiaochun L Chen
(74) *Attorney, Agent, or Firm* — Perkins Coie LLP

(57) ABSTRACT

Memory devices and systems with partial array refresh control over memory regions in a memory array, and associated methods, are disclosed herein. In one embodiment, a memory device includes a memory array having a first memory region and a second memory region. The memory device is configured to write data to the memory array in accordance with a programming sequence by initially writing data to unutilized memory cells of the first memory region before initially writing data to unutilized memory cells of the second memory region. The memory device is further configured to determine that the data stored on the first and/or second memory regions is not consolidated, and to consolidate at least a portion of the data by rewriting the portion of the data to physically or logically contiguous memory cells of the first memory region and/or the second memory region.

20 Claims, 4 Drawing Sheets

(56) References Cited

U.S. PATENT DOCUMENTS

| | | |
|---|---|---|
| 9,293,180 B2 | 3/2016 | Jeong et al. |
| 9,767,050 B2 | 9/2017 | Doo et al. |
| 9,767,882 B2 | 9/2017 | Shin et al. |
| 10,141,042 B1 | 11/2018 | Richter |
| 10,762,946 B2 | 9/2020 | Hiscock et al. |
| 10,803,926 B2 | 10/2020 | Hiscock et al. |
| 2003/0028711 A1 | 2/2003 | Woo et al. |
| 2009/0225616 A1 | 9/2009 | Hokenmaier et al. |
| 2016/0071591 A1 | 3/2016 | Hsu |
| 2020/0027512 A1* | 1/2020 | Yun .................. G11C 16/22 |
| 2020/0211626 A1 | 7/2020 | Hiscock et al. |
| 2020/0211636 A1 | 7/2020 | Hiscock et al. |
| 2020/0357461 A1 | 11/2020 | Hiscock et al. |

* cited by examiner

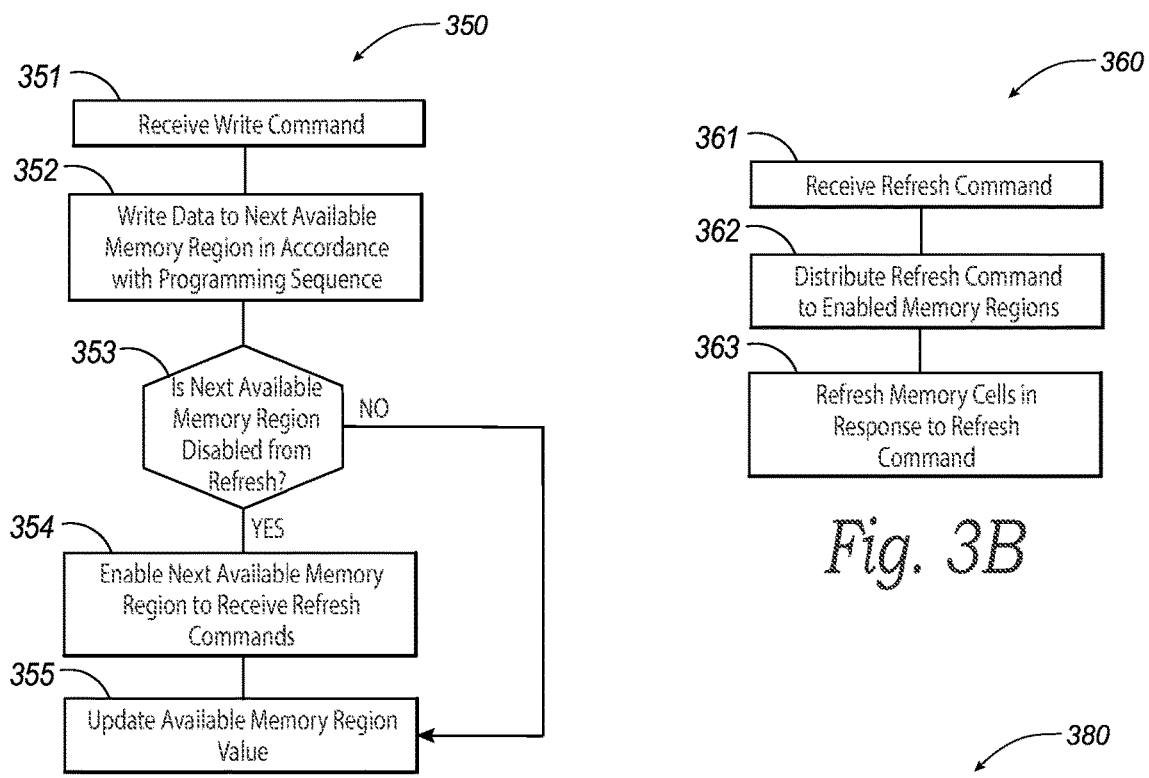
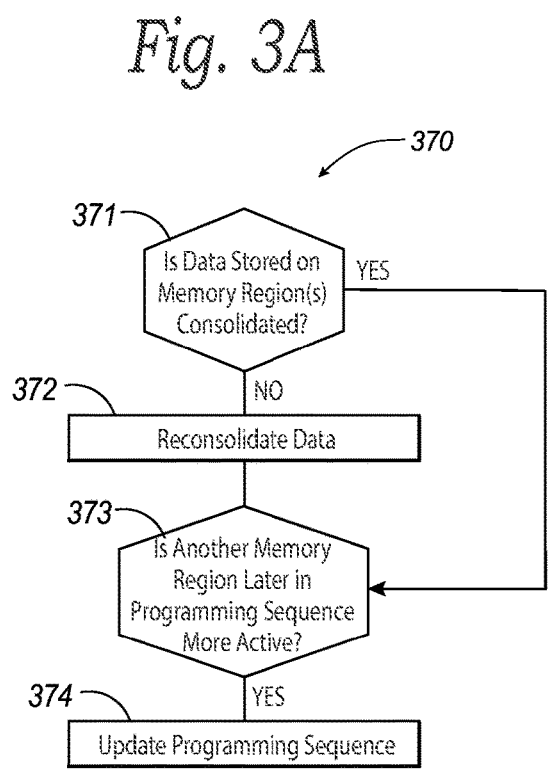
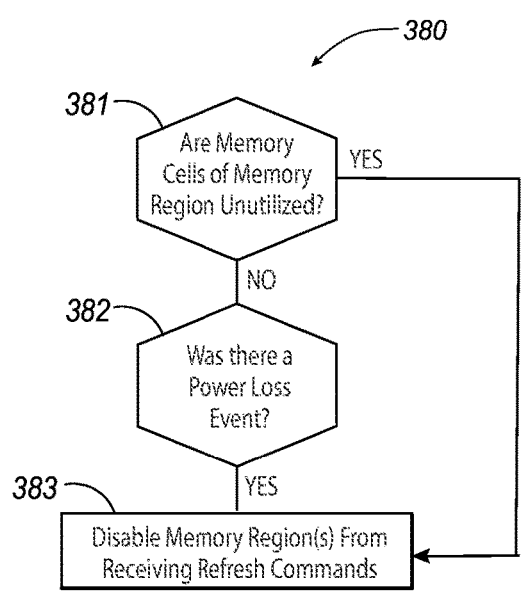
Fig. 3A
Fig. 3B
Fig. 3C
Fig. 3D

MEMORY WITH PARTIAL ARRAY REFRESH

CROSS-REFERENCE TO RELATED APPLICATION(S)

This application is a continuation of U.S. application Ser. No. 16/237,013, filed Dec. 31, 2018; which is incorporated herein by reference in its entirety.

This application contains subject matter related to U.S. patent application Ser. No. 16/237,115, filed Dec. 31, 2018, titled "MEMORY WITH ON-DIE DATA TRANSFER," and assigned to Micron Technology, Inc. The subject matter of U.S. patent application Ser. No. 16/237,115 is incorporated herein by reference thereto.

TECHNICAL FIELD

The present disclosure is related to memory systems, devices, and associated methods. In particular, the present disclosure is related to memory devices with partial array refresh.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random access memory (FeRAM), resistive random access memory (RRAM), and magnetic random access memory (MRAM), among others. Improving memory devices, generally, may include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

FIGS. 3A-3D are flow diagrams illustrating various routines of a memory device and/or a memory system configured in accordance with various embodiments of the present technology.

DETAILED DESCRIPTION

Figure 1:
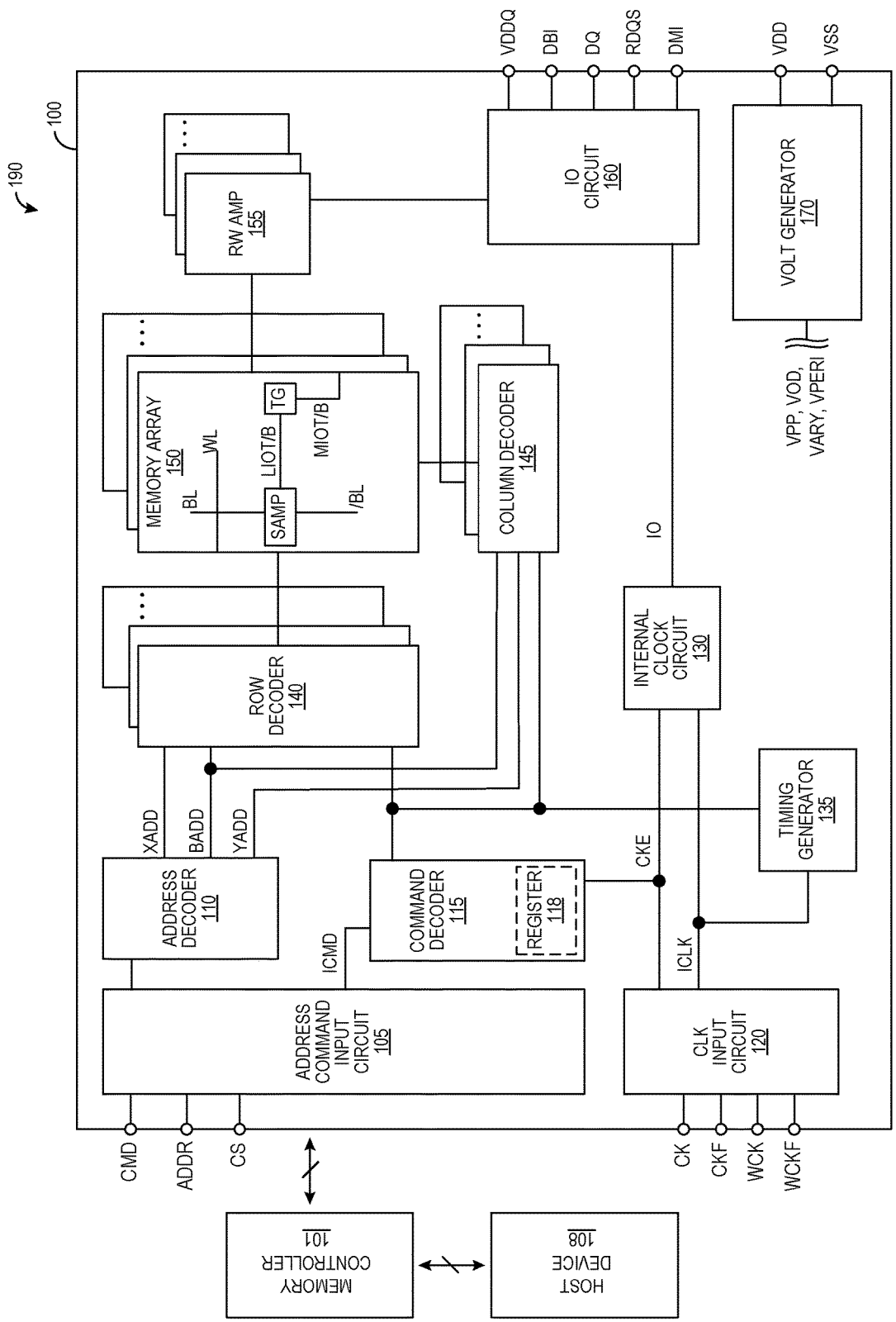
FIG. 1 is a block diagram schematically illustrating a memory system configured in accordance with various embodiments of the present technology.

As discussed in greater detail below, the technology disclosed herein relates to memory systems and devices with partial array refresh control over memory regions in a memory array, and associated methods. A person skilled in the art, however, will understand that the technology may have additional embodiments and that the technology may be practiced without several of the details of the embodiments described below with reference to FIGS. 1-4. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEROM), ferroelectric, magnetoresistive, and other storage media, including non-volatile, flash (e.g., NAND and/or NOR) storage media.

As used herein, the term "refresh" refers to various maintenance operations that can be performed on one or more memory cells of memory devices configured in accordance with various embodiments of the present technology. In some embodiments, the term "refresh" can refer to maintenance operations performed on one or more memory cells to maintain their data. For example, in the context of DRAM and other memory devices, the term "refresh" can refer to reading data from the one or more memory cells and rewriting the data to the one or more memory cells to increase the charge stored on the one or more memory cells to ameliorate charge leakage and to prevent data loss. In these and other embodiments, the term "refresh" can refer to reading data from the one or more memory cells and rewriting the data to the one or more memory cells in an inverted or other data state (e.g., from high to low or low to high), to ameliorate hysteresis shift, material depolarization, imprint and/or wear effects, or the like. In these and still other embodiments, the term "refresh" can refer to other maintenance operations, such as reading data from one or more memory cells and rewriting the data to one or more memory cells at another/other memory location(s).

Memory cells in a memory array of a memory device may be periodically refreshed to prevent data loss. For example, volatile memory devices, such as DRAM devices, may periodically refresh memory cells (e.g., by restoring charge levels programmed on the memory cells) to prevent data loss due to charge leakage. Refreshing the memory cells, however, often consumes a large amount of input/output (IO) bandwidth and power of the memory device, which can be further increased as the number of memory cells and/or refresh rates of the memory cells in the memory devices are increased. Thus, in the event that less than all of the memory cells in a memory array of a memory device are fully utilized (e.g., programmed with and/or storing non-stale data), refreshing each of the memory cells in the memory array to refresh utilized memory cells results in refreshing junk data stored on unutilized memory cells and in a waste of power.

To address these concerns, several embodiments of the present technology are directed to memory devices, systems including memory devices, and methods of operating memory devices in which memory cells in a memory array of a memory device are programmed in accordance with a programming sequence to keep data consolidated. In some embodiments, a memory controller of the memory device and/or a host device operably connected to the memory device can track which memory regions (e.g., memory banks, logical memory ranks or dies, etc.) include utilized memory cells. In these and other embodiments, refresh operations refresh only memory regions that contain utilized memory cells, thereby conserving power in relation to conventional refresh operations during which all memory regions are refreshed. In these and still other embodiments, as a portion of a memory region is no longer used, data stored on memory cells that remain utilized on the memory region can be transferred to another memory location on the same or a different memory region so that data stored on the memory device can be reconsolidated. In these and still other embodiments, the programming sequence can be changed such that a memory region that is no longer used or a memory region that is less active than another memory region is no longer refreshed during refresh operations. In this manner, memory devices (and associated systems and methods) configured in accordance with various embodiments of the present technology can refresh only memory regions that are currently utilized, thereby saving power and IO bandwidth over conventional refreshing schemes.

FIG. 1 is a block diagram schematically illustrating a memory system 190 configured in accordance with an embodiment of the present technology. The memory system 190 can include a memory device 100 that can be connected to any one of a number of electronic devices that is capable of utilizing memory for the temporary or persistent storage of information, or a component thereof. For example, the memory device 100 can be operably connected to a host device 108 and/or to a memory controller 101. The host device 108 operably connected to the memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device 108 may be a networking device (e.g., a switch, a router, etc.) or a recorder of digital images, audio and/or video, a vehicle, an appliance, a toy, or any one of a number of other products. In one embodiment, the host device 108 may be connected directly to the memory device 100, although in other embodiments, the host device 108 may be indirectly connected to the memory device 100 (e.g., over a networked connection or through intermediary devices, such as through the memory controller 101).

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, and power supply terminals VDD, VSS, and VDDQ.

The power supply terminals of the memory device 100 may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in a row decoder 140, the internal potentials VOD and VARY can be used in sense amplifiers included in a memory array 150 of the memory device 100, and the internal potential VPERI can be used in many other circuit blocks.

The power supply terminals may also be supplied with power supply potential VDDQ. The power supply potential VDDQ can be supplied to an input/output (IO) circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the IO circuit 160 so that power supply noise generated by the IO circuit 160 does not propagate to the other circuit blocks.

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from a command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from the command decoder 115. For example, the internal clock circuit 130 can include a clock path (not shown in FIG. 1) that receives the internal clock signal ICLK and provides various clock signals (not shown) to the command decoder 115. The internal clock circuit 130 can further provide input/output (IO) clock signals. The IO clock signals can be supplied to the IO circuit 160 and can be used as a timing signal for determining an output timing of read data and the input timing of write data. The IO clock signals can be provided at multiple clock frequencies so that data can be output from and input into the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated that can be used by the command decoder 115, the column decoder 145, and/or other components of the memory device 100.

The memory device 100 may include an array of memory cells, such as memory array 150. The memory cells of the memory array 150 may be arranged in a plurality of memory regions, and each memory region may include a plurality of word lines (WL), a plurality of bit lines (BL), and a plurality of memory cells arranged at intersections of the word lines and the bit lines. In some embodiments, a memory region can be one or more memory banks or another arrangement of memory cells. In these and other embodiments, the memory regions of the memory array 150 can be arranged in one or more groups (e.g., one or more groups of memory banks, one or more logical memory ranks or dies, etc.). Memory cells in the memory array 150 can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The command terminals and address terminals may be supplied with an address signal and a bank address signal from outside the memory device 100. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals can be supplied with command signals CMD, address signals ADDR, and chip selection signals CS (e.g., from the memory controller 101 and/or the host device 108). The command signals may represent various memory commands (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown) to the command decoder 115. The command decoder 115 may further include one or more registers 118 for tracking various counts or values (e.g., counts of refresh commands received by the memory device 100 or self-refresh operations performed by the memory device 100; memory regions enabled for refresh operations; a last programmed and/or next-to-be programmed memory cell, memory row, memory column, memory bank, logical memory rank or die, and/or other memory region; etc.).

When a read command is issued, and a row address and a column address are timely supplied with the read command, read data can be read from memory cells in the memory array 150 designated by these row address and column address. The read command may be received by the command decoder 115, which can provide internal commands to the IO circuit 160 so that read data can be output from the data terminals DQ, RDQS, DBI, and DMI via read/write (RW) amplifiers 155 and the IO circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued, and a row address and a column address are timely supplied with the command, write data can be supplied to the data terminals DQ, DBI, and DMI according to the WCK and WCKF clock signals. The write command may be received by the command decoder 115, which can provide internal commands to the IO circuit 160 so that the write data can be received by data receivers in the IO circuit 160, and supplied via the IO circuit 160 and the RW amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency information WL can be a number of clock cycles of the CK signal after the write command is received by the memory device 100 when the associated write data is received.

As described in greater detail below, when a write command is issued, the row address and a column address supplied with the write command can correspond to a programming sequence that defines a sequence of memory regions and/or locations to which the memory device 100 is configured to write new data. In this manner, data stored on the memory device 100 is consolidated on the memory device 100 at the time it is written to memory cells of the memory array 150. For example, the memory system 190 can write data to the memory array 150 in sequence, starting with memory cells in a first memory region (e.g., memory cells in a first memory bank in the memory array 150 and/or in each memory bank group). As a threshold number of the memory cells in the first memory region become utilized, the memory system 190 can proceed to write data to a next memory region (e.g., the next memory bank in the memory array 150 and/or the next memory bank in each memory bank group) in the programming sequence. As data is written to memory cells of the memory array 150, the memory system 190 can track the last programmed or next-to-be programmed memory region and/or location (e.g., the last programmed or next-to-be programmed memory cell, memory row, memory column, memory bank logical memory rank or die, etc.), such that data corresponding to a subsequent write command is written to the next-to-be programmed memory region and/or location and consolidates data stored on the memory array 150. In some embodiments, the memory system 190 can track the last programmed and/or the next-to-be programmed memory region and/or location using corresponding circuitry, such as one or more counters (e.g., a CBR counter), registers (e.g., the register 118), buffers, latches, embedded memories, etc., on the host device 108, on the memory controller 101, and/or on the memory device 100. In these and other embodiments, the corresponding circuitry can be reset in the event of power loss (e.g., powering down of the memory device 100) such that the memory system 190 is configured to write data to memory cells beginning at the first memory region and/or location in the programming sequence when the memory system 190 is subsequently powered on. In some embodiments, the programming sequence can be stored on the host device 108, on the memory controller 101, and/or on the memory device 100. In these and other embodiments, the programming sequence can be loaded into the host device 108, into the memory controller 101, and/or into the memory device 100 (e.g., as the memory system 190 is powered on).

The memory array 150 may be refreshed or maintained as described herein to prevent data loss, either due to charge leakage or imprint effects. A refresh operation, as described herein, may be initiated by the memory system 190 (e.g., by the host device 108, the memory controller 101, and/or the memory device 100), and may include accessing one or more rows (e.g., WL) and discharging cells of the accessed row to a corresponding SAMP. While the row is opened (e.g., while the accessed WL is energized), the SAMP may compare the voltage resulting from the discharged cell to a reference. The SAMP may then write back a logic value (e.g., charge the cell) to a nominal value for the given logic state. In some cases, this write back process may increase the charge of the cell to ameliorate the discharge issues discussed above. In other cases, the write back process may invert the data state of the cell (e.g., from high to low or low to high), to ameliorate hysteresis shift, material depolarization, or the like. Other refresh schemes or methods may also be employed.

In one approach, the memory device 100 may be configured to refresh the same row of memory cells in every memory bank of the memory array 150 simultaneously. In another approach, the memory device 100 may be configured to refresh the same row of memory cells in every memory bank of the memory array 150 sequentially. In still another approach, the memory device 100 can further include circuitry (e.g., one or more registers, latches, embedded memories, counters, etc.) configured to track row (e.g., word line) addresses, each corresponding to one of the memory banks in the memory array 150. In this approach, the memory device 100 is not constrained to refresh the same row in each memory bank of the memory array 150 before refreshing another row in one of the memory banks.

Regardless of the refresh approach, the memory device 100 can be configured to refresh memory cells in the memory array 150 within a given refresh rate or time window (e.g., 32 ms, 28 ms, 25 ms, 23 ms, 21 ms, 18 ms, 16 ms, 8 ms, etc.). In these embodiments, the memory system 190 can be configured to supply refresh commands to the memory device 100 in accordance with a specified minimum cadence tREFI. For example, the memory system 190 can be configured to supply one or more refresh commands to the memory device 100 at least every 7.8 μs such that an approximate minimum of 4000 refresh commands are supplied to the memory device 100 within a 32 ms time window.

As explained above, refreshing memory cells in the memory array 150 can consume a large amount of IO bandwidth and power, especially as the number of memory cells, the specified minimum cadence tREFI, and/or the refresh rates increase. In addition, it is unlikely that every memory cell in the memory array 150 is utilized (e.g., is programmed with and/or is storing non-stale data) at any given time. Thus, refreshing every memory cell in the memory array 150 during each refresh operation (as is performed during conventional refresh operations) results in refreshing memory cells that are not utilized and/or contain junk data, which constitutes a waste of IO bandwidth and/or power.

Figure 2:
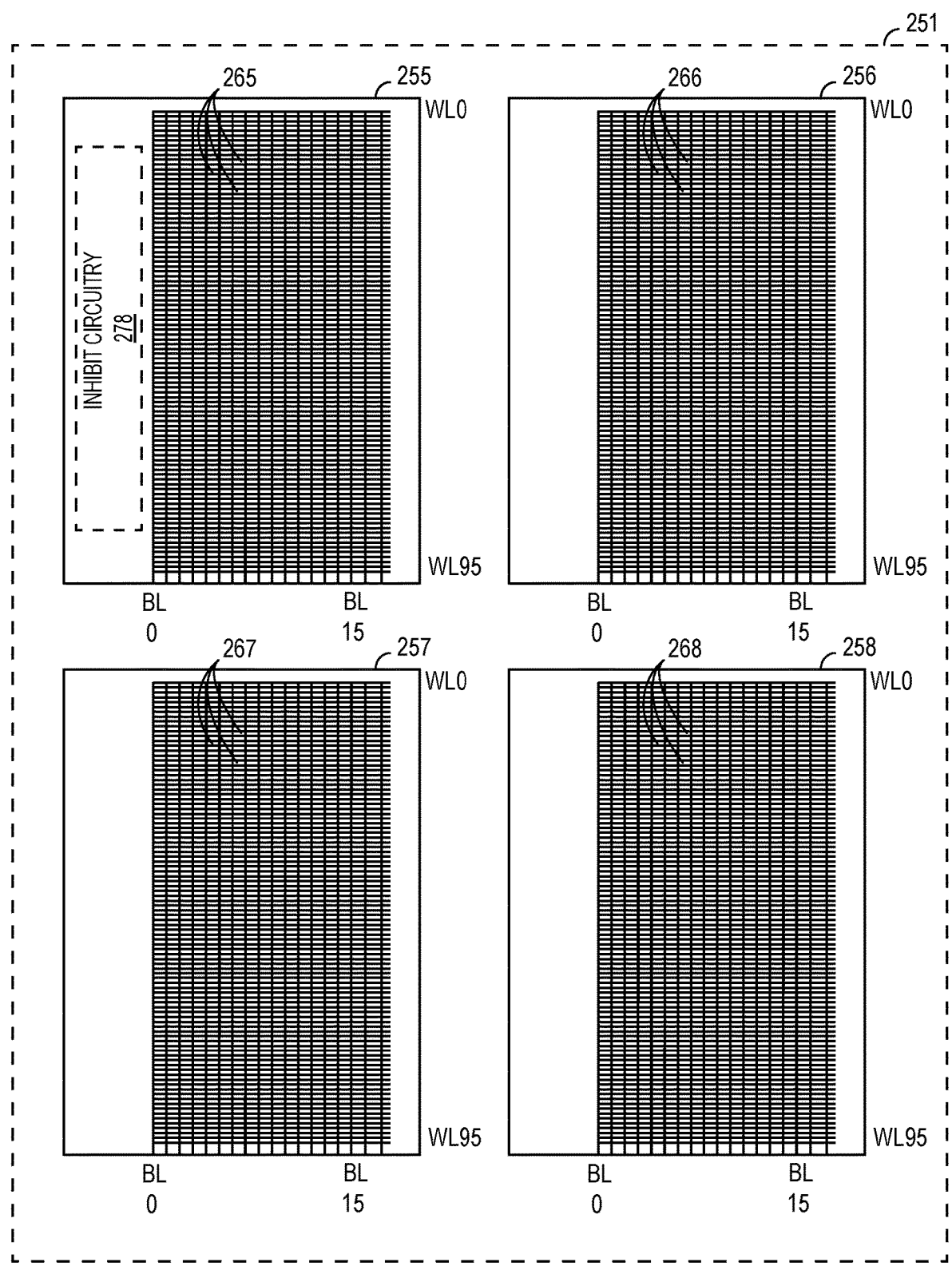
FIG. 2 is a block diagram schematically illustrating a memory bank region in a memory array of the memory device illustrated in FIG. 1.

FIG. 2 is a diagram schematically illustrating a memory region (in this case a memory bank group 251) in the memory array 150. As shown, the memory bank group 251 includes four memory banks 255-258 that each have a plurality of word lines WL0-WL95 and a plurality of bit lines BL0-BL15. Each of the memory banks 255-258 further include memory cells 265-268, respectively, at intersections of the respective word lines WL0-WL95 and bit lines BL0-BL17.

The memory bank 255 of the memory bank group 251 illustrated in FIG. 2 further includes inhibit circuitry 278 that is operably connected to the memory banks 255-258. Although illustrated as part of the memory bank 255 in FIG. 2, the inhibit circuitry 278 can be positioned at other locations on the memory system 190 in other embodiments, such as at other locations on the memory device 100 (e.g., inside or outside of the memory array 150, on and/or spread across one or more other memory banks of the memory array 150 in addition to or in lieu of the memory bank 255, etc.), on the memory controller 101, and/or on the host device 108. In some embodiments, the memory system 190 can include multiple inhibit circuits 278. For example, the memory system 190 can include an inhibit circuit 278 per memory region (e.g., per memory bank group, per logical memory rank or die, etc.). The inhibit circuitry 278 can include various hardware and/or software components, such as latches, registers, counters, control gates, and/or combinational logic (e.g., to track utilized memory cells).

In some embodiments, the inhibit circuitry 278 can be used by the memory system 190 to enable and/or disable one or more of the memory banks 255-258 from receiving refresh commands. For example, the inhibit circuitry 278 can disable the memory bank 255 from receiving refresh commands (e.g., by default or until the memory bank 255 registers an activate) by masking the memory bank 255 during refresh operations of the memory device 100. While disabled, the inhibit circuitry 278 can prevent the memory bank 255 from receiving refresh commands issued from memory system 190, thereby preventing the memory cells 265 of the memory bank 255 from being refreshed. In this manner, power that would otherwise be consumed by the memory device 100 to refresh the memory cells 265 of the memory bank 255 is saved.

In some embodiments, as the memory cells 265 of the memory bank 255 are programmed or are otherwise utilized (e.g., used to store non-stale data), the memory system 190 can use the inhibit circuitry 278 to enable the memory bank 255 (e.g., after the memory bank 255 registers an activate) to receive refresh commands by unmasking the memory bank 255 during refresh operations of the memory device 100. In other embodiments, the memory bank 255 can be enabled to receive refresh commands by default (e.g., by initially not masking the memory bank 255 during refresh operations of the memory device 100). While enabled, the memory bank 255 can receive refresh commands issued by the memory system 190 such that memory cells 265 of the memory bank 255 are refreshed. In these and other embodiments, when the memory cells 265 of the memory bank 255 are no longer utilized (e.g., the memory cells 265 are erased, are no longer programmed, and/or are programmed with stale data), the memory system 190 can use the inhibit circuitry 278 to disable the memory bank 255 from receiving refresh commands issued by the memory system 190. In some embodiments, disabling the memory bank 255 from receiving refresh commands using the inhibit circuitry 278 can include toggling a reset pin of the memory bank 255 such that the memory bank 255 is reset. In these and other embodiments, the memory system 190 can be configured to disable all or a subset of the memory banks in the memory device 100 in response to a power loss event of the memory device 100. In these and still other embodiments, the inhibit circuitry 278 can disable the memory bank 255 from receiving refresh commands by masking the memory bank 255.

In some embodiments, the memory bank 255 can be a first memory region of the memory device 100 in a programming sequence stored on the memory system 190. Therefore, as discussed above, the memory system 190 can be configured to write data to the memory cells 265 of the memory bank 255 in accordance with the programming sequence before writing data to memory cells of other memory regions (e.g., before writing data to memory cells of other memory banks in the memory array 150 (FIG. 1) and/or to the memory cells 266-268 of the other memory banks 256-258, respectively, in the memory bank group 251 in accordance with the programming sequence). As a threshold number (e.g., all or a portion) of the memory cells 265 of the memory bank 255 become utilized (e.g., are programmed and/or store non-stale data), the memory system 190 can be configured to write data to memory cells in a next memory region (e.g., to memory cells of a next memory bank in the memory array 150 and/or to the memory cells 266, 267, and/or 268 of the other memory banks 256, 257, and/or 258 in the memory bank group 251) in the programming sequence such that data stored on the memory device 100 is consolidated at the time it is written to the memory device 100. In these embodiments, the inhibit circuitry 278 and/or other corresponding inhibit circuitry of the next memory region in the programming sequence can enable the memory cells of the next memory region to receive refresh commands (e.g., after the next memory region has registered an activate). In some embodiments, the inhibit circuitry can enable the next memory region by unmasking the next memory region during refresh operations such that memory cells at the next memory region are refreshed.

In some embodiments, the memory system 190 can be configured to change or alter the programming sequence of the memory device 100. For example, the memory system 190 can include a first memory region and a second memory region that is later in the programming sequence than the first memory region. In these embodiments, the memory system 190 can be configured to alter the programming sequence if the second memory region becomes more active (e.g., memory cells of the second memory region become more utilized) than the first memory region. In these embodiments, memory cells of another memory region (e.g., memory cells of the second and/or another memory region later in the programming sequence) can be moved ahead of the memory cells of first memory region in the programming sequence and/or can be moved to the beginning of the programming sequence. In these and other embodiments, the memory system 190 can be configured to place the memory cells of the first memory region at the end of or at another position within the programming sequence such that memory cells of the second or other memory region(s) are programmed before the memory cells of the first memory region. This can permit memory cells of the first memory region to become unutilized (e.g., erased, no longer programmed, and/or programmed with stale data) over time. In turn, this can permit the memory system 190 to disable the memory cells of the first memory region from receiving refresh commands (e.g., by using the inhibit circuitry 278 and/or other corresponding inhibit circuitry to mask the first memory region during refresh operations of the memory device 100), thereby conserving power during refresh operations.

In these and other embodiments, the memory system 190 can be configured to alter the programming sequence if data stored on memory cells of the first memory region becomes stale, the memory cells of the first memory region are no longer programmed, and/or the memory cells at the first memory region are erased. In these and still other embodiments, the memory system 190 can be configured to periodically alter the programming sequence. For example, the memory system 190 can be configured to periodically alter the programming sequence to prolong the life of memory cells in the memory array 150.

In these and other embodiments, the memory system 190 can be configured to reconsolidate data within a memory region (e.g., within the memory bank 255) and/or across multiple memory regions in the memory array 150 (e.g., across one or more of the memory banks 255-258 in the memory bank group 251). For example, as some of the memory cells 265 in the memory bank 255 become unutilized while others of the memory cells 265 in the memory bank 255 remain utilized, data stored to the memory bank 255 and/or on the memory array 150 can become unconsolidated. In response, the memory system 190 in some embodiments can be configured to transfer (e.g., rewrite) the data stored in utilized memory cells 265 of the memory bank 255 to memory cells 265 at (e.g., physically or logically contiguous) memory locations within the memory bank 255. As a result, data stored on the memory bank 255 can be reconsolidated, and a greater amount of (e.g., physically or logically contiguous) memory cells 265 in the memory bank 255 can be made available to store data in subsequent write operations. In these and other embodiments, the memory system 190 can be configured to alter the programming sequence such that the unutilized memory cells 265 of the memory bank 255 are programmed before memory cells of other memory regions in the programming sequence. In these and still other embodiments, the memory system 190 can be configured to transfer (e.g., rewrite) the data stored in utilized memory cells 265 of the memory bank 255 to memory cells of another memory region (e.g., to memory cells of a more active memory bank) in the memory array 150. In this manner, data stored to the memory array 150 can be reconsolidated. Additionally, the memory system 190 in some embodiments can disable the memory bank 255 from receiving refresh commands once the data stored on the utilized memory cells 265 of the memory bank 255 is transferred to another memory region of the memory array 150, thereby conserving power during refresh operations and opening the memory cells 265 of the memory bank 255 to store data in subsequent write operations.

Although memory regions are primarily discussed above in the context of entire memory banks in the memory array 150, any of the above operations can be carried out at different levels of the memory system 190. For example, memory regions in other embodiments can include individual memory cells and/or any combination of word lines and associated bit lines internal to the memory device 100 (e.g., logical memory ranks or dies). Thus, in embodiments where a memory region includes logical memory ranks or dies, the memory system 190 can use inhibit circuitry to enable or disable entire logical memory ranks or dies from receiving refresh commands such that one or more memory banks in a given logical memory rank or die are enabled (e.g., are not masked or are unmasked) or disabled (e.g., are masked) from receiving refresh commands. In these and other embodiments, inhibit circuitry can disable a given logical memory rank or die until the logical memory rank or die or individual memory banks within the logical rank or die register an activate. In these and still other embodiments, disabling a previously enabled logical rank or memory die can include toggling one or more reset pins of the previously enabled logical memory rank or die and/or of the memory banks in the previously enabled logical memory rank or die (e.g., in response to a power loss event of the memory device 100). Furthermore, although the memory system 190 is discussed above in the context of issuing one refresh command that is passed to or masked from individual memory regions (e.g., logical memory ranks or dies, memory banks, etc.), the memory system 190 in other embodiments can be configured to issue more than one refresh command. For example, the memory system 190 in other embodiments can be configured to individually issue a refresh command to each memory region of the memory device 100 that is enabled to receive refresh commands.

FIGS. 3A-3D are flow diagrams illustrating various routines of a memory device configured in accordance with various embodiments of the present technology. In particular, FIG. 3A is a flow diagram illustrating a programming routine 350, FIG. 3B is a flow diagram illustrating a refresh routine 360, FIG. 3C is a flow diagram illustrating a reconsolidation routine 370, and FIG. 3D is a flow diagram illustrating a disabling routine 380. In some embodiments, the routines 350, 360, 370, and/or 380 can be executed, at least in part, by the memory device, a memory controller operably connected to the memory device, and/or a host device operably connected to the memory controller and/or to the memory device. For example, the routines 350, 360, 370, and/or 380 can be carried out by a row decoder, inhibit circuitry, a CBR counter, a memory array, a memory bank, and/or a logical memory rank or die. In these and other embodiments, all or a subset of the steps of the routines 350, 360, 370, and/or 380 can be performed by other components of the memory device (e.g., a command decoder), by components of the memory controller, by components of the host device, and/or by other components of a memory system containing the memory device.

Referring to FIG. 3A, the routine 350 can begin at block 351 by receiving a write/program command. In some embodiments, the write command can be issued by a host device and/or a memory controller operably connected to the memory device. In these and other embodiments, the write command can be issued by the memory device and/or other components of the memory system.

At block 352, the routine 350 can write data to a next memory region (e.g., a next available memory region) of the memory device in accordance with a programming sequence. The programming sequence can define an order of memory regions and/or locations (e.g., memory rows (word lines), memory columns (bit lines) memory banks, memory bank groups, logical memory ranks or dies, etc.) in the memory device to which the routine 350 sequentially writes data. In some embodiments, the programming sequence can be a predefined programming sequence (e.g., one defined during manufacture of and/or powering on of the memory device). In these and other embodiments, the programming sequence can be stored on the memory device and/or on other components of the memory system (e.g., on the host device and/or on the memory controller). In these and still other embodiments, the programming sequence can be loaded into the memory device, the memory controller, and/or the host device (e.g., when the memory device is powered on).

In some embodiments, the routine 350 can track the last programmed or next-to-be programmed memory region (e.g., memory row (word line), memory column (bit line) memory bank, memory bank group, logical memory rank or die, etc.) in the programming sequence by storing a corresponding value on the memory device, on the memory controller, and/or on the host device. In these embodiments, the routine 350 can reference the programming sequence (e.g., the stored value) to determine one or more row and column addresses corresponding to the next available memory region, to supply the one or more row and column address corresponding to the next available memory region to the memory device, and/or to write data to memory cells of the next available memory region at the corresponding one or more row and column addresses. For example, after the memory device is powered on, the routine 350 can initially retrieve one or more row and column addresses corresponding to a first memory region (e.g., a first memory bank and/or logical memory rank or die in the memory device, a first memory bank in each memory bank group, etc.) in the programming sequence, supply the one or more row and column addresses corresponding to the first memory region in the programming sequence to the memory device, and/or write data to the first memory region in the programming sequence at memory locations corresponding to the one or more row and column addresses. As described in greater detail below with respect to block 355, the routine 350 can update the stored value to reflect the last programmed and/or the next-to-be programmed memory region such that the routine 350 can reference the stored value and write data to the next-to-be programmed memory region during a subsequent write operation.

At block 353, the routine 350 determines whether the next available memory region is disabled from receiving refresh commands. In some embodiments, the routine 350 can track and/or determine which memory regions are enabled and/or disabled from receiving refresh operations by using a table and/or other values stored on the memory device, on the memory controller, and/or on the host device. If the routine 350 determines the next available memory region is disabled from receiving refresh operations, the routine 350 can proceed to block 354. On the other hand, if the routine 350 determines that the next available memory region is not disabled from receiving refresh operations, the routine 350 can proceed to block 355.

At block 354, the routine 350 can enable the next available memory region to receive refresh commands. In some embodiments, the routine 350 can enable the next available memory region to receive refresh commands using inhibit circuitry corresponding to the next available memory region. In these and other embodiments, the routine 350 can enable the next available memory region to receive refresh commands by registering an activate of the next available memory region (e.g., with the host device, with the memory controller, and/or with the memory device). For example, memory regions in the memory device can be disabled from receiving refresh operations by default until memory cells on the next available memory region are utilized (e.g., are programmed with and/or store non-stale data). In these embodiments, the first time the routine 350 writes data to memory cells of the next available memory region, the routine 350 can register an activate of the next available memory region to enable the next available memory region to receive refresh commands. In these and still other embodiments, a memory region can be disabled from receiving refresh commands by masking the next available memory region from receiving refresh commands. In these embodiments, the routine 350 can enable the next available memory region to receive refresh commands by removing the mask from (e.g., by not masking) the next available memory region during refresh operations.

At block 355, the routine 350 can update the stored value referenced at block 352 to reflect the last programmed or next-to-be programmed memory region. In this manner, the routine 350 can reference the updated value during a subsequent write operation and can write data to the memory device in accordance with the programming sequence such that data stored on the memory device is consolidated at the time it is written to the memory device. As described in greater detail below with respect to the routine 380 (FIG. 3D), the routine 380 can reset the stored value in the event of power loss to the memory device such that the routine 350 writes data to the first memory region in the programming sequence after the stored value has been reset and the memory device is powered on.

Referring to FIG. 3B, the refresh routine 360 can begin at block 361 by receiving a refresh command. In some embodiments, the refresh command can be issued by a host device and/or a memory controller operably connected to the memory device. In these and other embodiments, the refresh command can be issued by the memory device and/or another component of the memory system.

At block 362, the routine 360 can distribute the refresh command to memory regions of the memory device that are enabled to receive refresh commands. In some embodiments, the routine 360 can distribute the refresh command to enabled memory regions by individually sending a refresh command to each enabled memory region. In other embodiments, the routine 360 can distribute the refresh command to enabled memory regions by masking disabled memory regions (e.g., using corresponding inhibit circuitry) from receiving a refresh command sent to all or a subset of the memory regions in the memory device.

At block 363, the routine 360 can refresh memory cells of memory regions that receive the refresh command(s). In some embodiments, the routine 360 can refresh the memory cells by accessing one or more rows (e.g., WL) of a memory region and discharging cells of the accessed row to a corresponding SAMP. While a row is opened (e.g., while the accessed word line is energized), the routine 360 can compare the voltage resulting from the discharged cell to a reference, and/or the routine 360 can write back a logic value (e.g., charge the cell) to a nominal value for the given logic state. In some cases, the write back process can increase the charge of the cell to ameliorate the discharge issues discussed above. In other cases, the write back process can invert the data state of the cell (e.g., from high to low or low to high), to ameliorate hysteresis shift, material depolarization or the like. In this manner, only memory cells of enabled memory regions are refreshed in response to a refresh command received at block 361.

Referring to FIG. 3C, the reconsolidation routine 370 can begin at block 371 by determining whether data stored on one or more memory regions is consolidated. In some embodiments, the routine 370 can determine whether data stored on the one or more memory regions is consolidated by determining memory locations of memory cells storing stale data. In these and other embodiments, the routine 370 can determine whether data stored on the one or more memory regions is consolidated by tracking the memory locations of memory cells storing non-stale data. If the routine 370 determines that data stored on the one or more memory regions is not consolidated, the routine 370 can proceed to block 372. On the other hand, if the routine 370 determines that data stored on the one or more memory regions is consolidated, the routine 370 can proceed to block 373.

At block 372, the routine 370 can reconsolidate data stored to one or more memory regions of the memory device. In some embodiments, the routine 370 can reconsolidate data stored on one or more memory regions by transferring data stored on a memory region (e.g., a memory bank) to physically or logically contiguous memory locations on the same memory region. In these and other embodiments, the routine 370 can reconsolidate data stored on one or more memory regions by transferring data stored on a memory region (e.g., on a memory bank) to memory locations (e.g., physically or logically contiguous memory locations) on another memory region (e.g., another memory bank).

At block 373, the routine 370 can determine whether a memory region of the memory device later in the programming sequence is more active than a memory region of the memory device earlier in the programming sequence. In some embodiments, a memory region can be considered more active than another memory region of the memory device when more memory cells of a memory region are utilized (e.g., programmed with and/or store non-stale data) than memory cells of the other memory region. If the routine 370 determines that a memory region of the memory device later in the programming sequence is more active than a memory region earlier in the programming sequence, the routine 370 can proceed to block 374.

At block 374, the routine 370 can update (e.g., change or alter) the programming sequence of the memory device. For example, the routine 370 can move a more active memory region of the memory device later in the programming sequence ahead of a less active memory region earlier in the programming sequence (such that the more active memory region is ahead of the less active memory region in the programming sequence). In these embodiments, the routine 350 (FIG. 3A) can be configured to write data to the more active memory region before writing data to the less active memory region. As a result, memory cells of the less active memory region can become unutilized (e.g., by transferring data on the less active memory region to another memory region, allowing the data stored on the less active memory region to become stale, etc.), and/or the less active memory region can be disabled from receiving refresh commands (as discussed below with regard to the disabling routine 380 illustrated in FIG. 3D). In these and other embodiments, the routine 370 can position the less active memory region at the end of or at another position within the programming sequence.

In these and still other embodiments, routine 370 can update the programming sequence regardless of whether a memory region later in the programming sequence is more active than a memory region earlier in the programming sequence. For example, the routine 370 can alter the order of the memory regions in the programming sequence such that another memory region is listed as the first memory region in the programming sequence and is therefore programmed ahead of the other memory regions. In this manner, the routine 370 can prolong the life of the memory cells in the memory device by distributing the programming of data across memory cells of multiple memory regions and/or enabling other memory cells for refresh operations.

Referring to FIG. 3D, the disabling routine 380 can begin at block 381 to determine whether memory cells of a memory region that is enabled to receive refresh commands are unutilized (e.g., are not programmed, are erased, and/or are storing stale data). In some embodiments, the routine 380 can determine that memory cells of a memory region are unutilized when a threshold number (e.g., all or subset) of the memory cells in the memory region are unutilized. If the routine 380 determines that memory cells of an enabled memory region are unutilized, the routine 380 can proceed to block 383. On the other hand, if the routine 380 determines that memory cells of an enabled memory region are utilized (e.g., are programmed with and/or are storing non-stale data), the routine 380 can proceed to block 382.

At block 382, the routine 380 can determine whether a power loss event has occurred. In some embodiments, a power loss event can occur when power supplied to the memory device is interrupted (e.g., for a threshold period of time) or is terminated. If the routine 380 determines that a power loss event has occurred, the routine 380 can proceed to block 383.

At block 383, the routine can disable one or more memory regions from receiving refresh commands. For example, in the event of a power loss event, the routine 380 can disable all or a subset of memory regions of the memory device from receiving refresh operations. In these and other embodiments, the routine 380 can disable an otherwise enabled memory region from receiving refresh operations when the routine 380 determines that all or a subset of the memory cells of the memory region are unutilized. In some embodiments, the routine 380 can disable a memory region from receiving refresh commands by using corresponding inhibit circuitry. In these and other embodiments, the routine 380 can disable a memory region from receiving refresh commands by masking the memory region from receiving a refresh command received by the memory device, as discussed above with respect to the refresh routine 360 (FIG. 3B). In these and still other embodiments, the routine 380 can toggle a reset pin of a memory region when disabling a memory region from receiving refresh commands.

Although the steps of the routines 350, 360, 370, and 380 are discussed and illustrated in a particular order, the methods illustrated by the routines 350, 360, 370, and 380 in FIGS. 3A-3D, respectively, are not so limited. In other embodiments, the methods can be performed in a different order. In these and other embodiments, any of the steps of the routines 350, 360, 370, and 380 can be performed before, during, and/or after any of the other steps of the routines 350, 360, 370, and 380. For example, (i) block 355 of the programming routine 350 illustrated in FIG. 3A can be performed before blocks 353 and/or 354; (ii) blocks 373 and/or 374 of the reconsolidation routine 370 illustrated in FIG. 3C can be performed before blocks 371, 372, and/or 373; and/or (iii) blocks 382 and/or 383 of the disable routine 380 illustrated in FIG. 3D can be performed before blocks 381 and/or 382. Moreover, a person of ordinary skill in the relevant art will readily recognize that the illustrated methods can be altered and still remain within these and other embodiments of the present technology. For example, one or more steps of the routines 350, 360, 370, and 380 illustrated in FIGS. 3A-3D can be omitted and/or repeated in some embodiments. In these and other embodiments, one or more steps of the routines 350, 360, 370, and/or 380 can be combined to form one or more other routines of the memory device.

Figure 4:
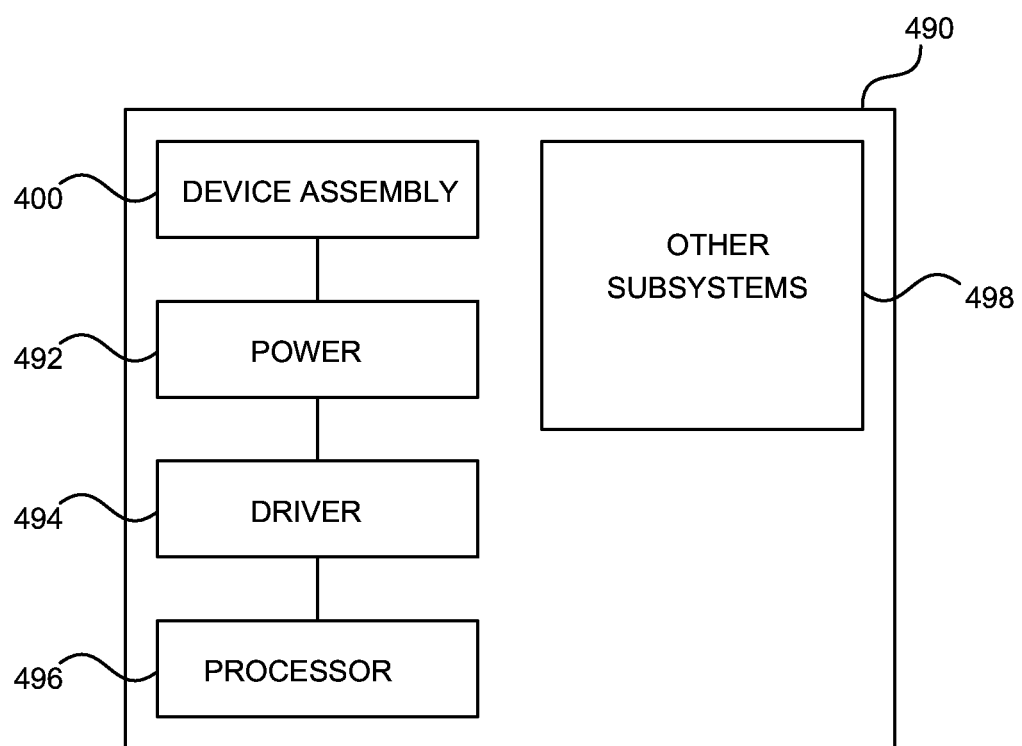
FIG. 4 is a schematic view of a system that includes a memory device configured in accordance with various embodiments of the present technology.

FIG. 4 is a schematic view of a system that includes a memory device in accordance with embodiments of the present technology. Any one of the foregoing memory devices described above with reference to FIGS. 1-3D can be incorporated into any of a myriad of larger and/or more complex systems, a representative example of which is system 490 shown schematically in FIG. 4. The system 490 can include a semiconductor device assembly 400, a power source 492, a driver 494, a processor 496, and/or other subsystems and components 498. The semiconductor device assembly 400 can include features generally similar to those of the memory device described above with reference to FIGS. 1-3D, and can, therefore, include various features of memory content authentication. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, vehicles, appliances, and other products. Components of the system 490 may be housed in a single unit or distributed over multiple, interconnected units (e.g., through a communications network). The components of the system 490 can also include remote devices and any of a wide variety of computer readable media.

CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented and/or discussed in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:

1. A memory device, comprising:
a memory array including a first memory region and a second memory region,
wherein the memory device is configured to:
in response to a write command, initially write first data to the memory array in accordance with a predefined programming sequence by writing the first data to unutilized memory cells of the first memory region before unutilized memory cells of the second memory region, wherein the predefined programming sequence defines an order of memory locations in the memory device to which the memory device sequentially writes data,
determine that the first data stored on the first and/or second memory regions is not consolidated, and
consolidate at least a portion of the first data by rewriting the portion of the first data to physically or logically contiguous memory cells of the first memory region and/or the second memory region.

2. The memory device of claim 1, wherein, to determine that the first data stored on the first and/or second memory regions is not consolidated, the memory device is further configured to determine memory locations of memory cells of the first and/or the second memory regions storing stale data.

3. The memory device of claim 1, wherein, to determine that the first data stored on the first and/or second memory regions is not consolidated, the memory device is further configured to track memory locations of memory cells of the first and/or the second memory regions storing non-stale data.

4. The memory device of claim 1, wherein, to consolidate at least the portion of the first data, the memory device is configured rewrite the portion of the first data from the first memory region to physically or logically contiguous memory cells of the first memory region.

5. The memory device of claim 1, wherein, to consolidate at least the portion of the first data, the memory device is configured to rewrite the portion of the first data from the second memory region to physically or logically contiguous memory cells of the first memory region.

6. The memory device of claim 1, wherein the write command in a first write command, and wherein the memory device is further configured to update the predefined programming sequence such that the memory device is configured to, in response to a second write command, initially write second data to unutilized memory cells of the second memory region before unutilized memory cells of the first memory region.

7. The memory device of claim 6, wherein the memory device is configured to update the predefined programming sequence when the second memory region includes a greater number of utilized memory cells than the first memory region.

8. A method, comprising:
in response to a write command, initially writing first data to a memory array of a memory device in accordance with a predefined programming sequence by writing the first data to unutilized memory cells of a first memory region of the memory array before unutilized memory cells of a second memory region of the memory array, wherein the predefined programming sequence defines an order of memory locations in the memory device to sequentially write data;
determining that the first data stored on the first and/or the second memory regions is not consolidated; and
consolidating at least a portion of the first data by rewriting the portion of the first data to physically or logically contiguous memory cells of the first memory region and/or the second memory region.

9. The method of claim 8, wherein determining that the first data stored on the first and/or the second memory regions is not consolidated includes determining memory locations of memory cells of the first memory region and/or of the second memory region storing stale data.

10. The method of claim 8, wherein determining that the first data stored on the first and/or the second memory regions is not consolidated includes determining memory locations of memory cells of the first memory region and/or of the second memory region storing non-stale data.

11. The method of claim 8, wherein consolidating the portion of the first data includes rewriting the portion of the first data from the first memory region to physically or logically contiguous memory cells of the first memory region.

12. The method of claim 8, wherein consolidating the portion of the first data includes rewriting the portion of the first data from the second memory region to physically or logically contiguous memory cells of the first memory region.

13. The method of claim 8, wherein the write command is a first write command, and wherein the method further comprises updating the predefined programming sequence such that the memory device is configured to, in response to a second write command, initially write second data to unutilized memory cells of the second memory region before unutilized memory cells of the first memory region.

14. The method of claim 13, wherein updating the predefined programming sequence includes updating the predefined programming sequence when the second memory region includes a greater number of utilized memory cells than the first memory region.

15. A memory system, comprising:
a memory controller;
a memory device operably connected to the memory controller, wherein the memory device includes a memory array including a first memory region and a second memory region,
wherein the memory controller and/or the memory device are configured to:
in response to a write command, initially write first data to the memory array in accordance with a predefined programming sequence by initially writing the first data to unutilized memory cells of the first memory region before unutilized memory cells of the second memory region, wherein the predefined programming sequence defines an order of memory locations in the memory device to which the memory controller and/or the memory device sequentially write data, determine that the first data stored on the first and/or the second memory regions is not consolidated, and consolidate at least a portion of the first data by rewriting the portion of the first data to physically or logically contiguous memory cells of the first memory region and/or the second memory region.

16. The memory system of claim 15, wherein, to determine that the first data stored on the first and/or second memory regions is not consolidated, the memory controller and/or memory device is further configured to determine memory locations of memory cells of the first and/or the second memory regions storing stale data and/or storing non-stale data.

17. The memory system of claim 15, wherein, to consolidate at least the portion of the first data, the memory controller and/or the memory device is configured rewrite the portion of the first data from the first memory region to physically or logically contiguous memory cells of the first memory region.

18. The memory system of claim 15, wherein, to consolidate at least the portion of the first data, the memory controller and/or the memory device is configured to rewrite the portion of the first data from the second memory region to physically or logically contiguous memory cells of the first memory region.

19. The memory system of claim 15, wherein the write command is a first write command, and wherein the memory controller and/or the memory device is further configured to update the predefined programming sequence such that the memory controller and/or the memory device is configured to, in response to a second write command, initially write second data to unutilized memory cells of the second memory region before unutilized memory cells of the first memory region.

20. The memory system of claim 19, wherein the memory controller and/or the memory device is configured to update the predefined programming sequence when the second memory region includes a greater number of utilized memory cells than the first memory region.

* * * * *